US012426196B2

(12) United States Patent
Liu et al.

(10) Patent No.: US 12,426,196 B2
(45) Date of Patent: Sep. 23, 2025

(54) SWITCHING BOARD AND SOLDERING METHOD THEREOF

(71) Applicant: AEWIN TECHNOLOGIES CO., LTD., New Taipei (TW)

(72) Inventors: Cheng-En Liu, New Taipei (TW); Chun-Han Chen, New Taipei (TW); Hao-Yang Huang, New Taipei (TW); Yi-Tsang Hsiao, New Taipei (TW); Jui-Chung Lai, New Taipei (TW); Kai-Hsiang Tseng, New Taipei (TW); Shih-Tsung Chen, New Taipei (TW)

(73) Assignee: AEWIN TECHNOLOGIES CO., LTD., New Taipei (TW)

( * ) Notice: Subject to any disclaimer, the term of this patent is extended or adjusted under 35 U.S.C. 154(b) by 260 days.

(21) Appl. No.: 18/237,149

(22) Filed: Aug. 23, 2023

(65) Prior Publication Data
US 2024/0407126 A1 Dec. 5, 2024

(30) Foreign Application Priority Data
May 29, 2023 (TW) .................................. 112119949

(51) Int. Cl.
| B23K 1/008 | (2006.01) |
| B23K 1/00 | (2006.01) |
| H05K 1/02 | (2006.01) |
| H05K 7/14 | (2006.01) |
| H05K 7/20 | (2006.01) |
| B23K 101/42 | (2006.01) |

(52) U.S. Cl.
CPC ......... *H05K 7/1492* (2013.01); *B23K 1/0016* (2013.01); *B23K 1/008* (2013.01); *H05K 1/0271* (2013.01); *H05K 7/20818* (2013.01); *B23K 2101/42* (2018.08); *H05K 2201/10371* (2013.01)

(58) Field of Classification Search
CPC .. B23K 1/008; B23K 2101/42; B23K 1/0016; H05K 1/02; H05K 7/1492; H05K 5/0018; H05K 1/0201; H05K 1/0271; H05K 1/18; H05K 7/14; H05K 7/2029; H05K 7/203; H05K 7/20818
USPC .......................................................... 361/748
See application file for complete search history.

(56) References Cited

U.S. PATENT DOCUMENTS 10,944,202 B1 * 3/2021 Tung .................... H05K 5/069

* cited by examiner

*Primary Examiner* — Timothy J Thompson
*Assistant Examiner* — Michael F McAllister
(74) *Attorney, Agent, or Firm* — RANKIN, HILL & CLARK LLP

(57) ABSTRACT

A switching board and a soldering method thereof are provided. The switching board includes a circuit board having a board body and a first metal ring, where the board body has a first surface, and the first metal ring is formed on the first surface and surrounds a periphery of the board body. The switching board further includes a first metal element disposed on the first surface and fastened to the first metal ring by soldering. The switching board has a high pressure resistance and a low leakage rate.

17 Claims, 7 Drawing Sheets

SWITCHING BOARD AND SOLDERING METHOD THEREOF

CROSS-REFERENCE TO RELATED APPLICATIONS

This application claims priority to Taiwan Application Serial No. 112119949, filed on May 29, 2023. The entirety of the above-mentioned patent application is hereby incorporated by reference herein and made a part of this specification.

BACKGROUND

1. Technical Field

The present disclosure relates to a switching board and a soldering method thereof, and more particularly, to a switching board disposed on a two-phase immersion cooling positive high pressure sealed tank and a soldering method thereof.

2. Description of Related Art

A two-phase immersion cooling method utilizes phase changes between gas and liquid states of a water cooling liquid to carry heat away, and high pressure vapor needs to be maintained in a sealed tank to facilitate condensation. However, signal lines of a server in the sealed tank (such as high-speed fiber optic network and Universal Serial Bus [USB] signal lines) need to be externally connected. Accordingly, a switching board is provided so as to allow the signal lines to pass through the sealed tank. However, when the signal lines pass through the switching board disposed on the conventional sealed tank, high pressure water cooling vapor may escape through signal line outlets. The more externally connected signal lines, the more signal line outlets, thus increasing the leakage rate of the water cooling liquid. Further, the conventional switching board is difficult to withstand high pressure. Although the conventional sealed tank can be provided with special terminals such as vacuum inlet terminals (Feedthrough Pin Headers) to reduce the leakage rate, such terminals are expensive and cannot be replaced at any time according to demands and hence are not convenient to use.

SUMMARY

In view of the above-described drawbacks of the prior art, the present disclosure provides a switching board disposed on a two-phase immersion cooling positive high pressure sealed tank. The switching board comprises: a circuit board having a board body and a first metal ring, wherein the board body has a first surface, and the first metal ring is formed on the first surface and surrounds a periphery of the board body; and a first metal element disposed on the first surface and fastened to the first metal ring by soldering.

In the aforementioned switching board, the circuit board further has a plurality of switching elements and a plurality of second metal rings, wherein the plurality of switching elements are disposed on the first surface and spaced apart from one another, and the plurality of second metal rings are formed on the first surface and surround the plurality of switching elements, respectively.

In the aforementioned switching board, the first metal element is further fastened to the plurality of second metal rings by soldering.

In the aforementioned switching board, the first metal element has a plurality of first openings arranged in a manner that after the first metal element is fastened to the plurality of second metal rings by soldering, the plurality of first openings are surrounded by the plurality of second metal rings and the plurality of switching elements are exposed from the plurality of first openings, respectively.

In the aforementioned switching board, the circuit board further has a plurality of vias penetrating through the board body, and the plurality of vias are neither located inside the plurality of second metal rings nor exposed from the plurality of first openings.

In the aforementioned switching board, the first metal element completely covers all regions of the first surface inside the first metal ring and outside the plurality of second metal rings.

In the aforementioned switching board, the first metal ring and the plurality of second metal rings are made of copper foil.

In the aforementioned switching board, the first metal element is fastened to the first metal ring and the plurality of second metal rings by a soldering process using a solder paste and a baking process using a baking unit.

In the aforementioned switching board, the board body further has a second surface opposing the first surface, and the switching board further comprises a second metal element disposed on the second surface.

In the aforementioned switching board, the second metal element has a plurality of second openings, wherein the circuit board further has a plurality of gold finger elements formed on the second surface and spaced apart from one another, and the plurality of gold finger elements are exposed from the plurality of second openings and electrically connected to the plurality of switching elements, respectively.

In the aforementioned switching board, the first metal element faces an inner side of the two-phase immersion cooling positive high pressure sealed tank, and the second metal element faces an outer side of the two-phase immersion cooling positive high pressure sealed tank.

In the aforementioned switching board, the first metal element and the second metal element are made of aluminum.

The present disclosure further provides a soldering method of a switching board, the soldering method comprises: providing a circuit board and a first metal element, wherein the circuit board has a board body and a plurality of second metal rings, the board body has a first surface, and the plurality of second metal rings are formed on the first surface and spaced apart from one another; applying a first solder paste onto the plurality of second metal rings, and disposing and fastening the first metal element onto the first surface with a fastener to allow the first solder paste to be sandwiched between the first metal element and the circuit board; and feeding the circuit board and the first metal element fastened with the fastener into a baking unit, and performing baking at a temperature for a period of time.

In the aforementioned soldering method, the circuit board further has a first metal ring formed on the first surface and surrounding a periphery of the board body.

In the aforementioned soldering method, the present disclosure further comprises: after completing baking, removing the circuit board and the first metal element fastened with the fastener from the baking unit and leaving the circuit board and the first metal element to cool down, applying a second solder paste to the first metal ring, feeding the circuit board and the first metal element fastened with the fastener into the baking unit, and performing baking at the temperature for the period of time.

In the aforementioned soldering method, the temperature is 220 degrees, and the period of time is 30 minutes.

In the aforementioned soldering method, the first solder paste applied to one of the plurality of second metal rings has a weight of 88 grams.

To sum up, in the switching board and the soldering method thereof according to the present disclosure, by soldering the first metal element on the circuit board, the pressure resistance of the circuit board can be increased and the risk of cracking or deformation of the circuit board under pressure can be reduced. Also, the plurality of vias are formed inside the first metal ring and outside the second metal rings by circuit arrangement, and the first metal element is further soldered to the second metal rings. As such, high pressure water cooling vapor that may leak from the switching elements cannot pass through the regions where the plurality of vias are located since the switching elements are surrounded by the second metal rings, respectively, thus achieving a complete sealing effect between the circuit board and the first metal element. Further, the circuit board is supported by the metal elements on both sides thereof so as to achieve a high pressure resistance. The switching board and the soldering method thereof according to the present disclosure have a low fabrication cost and a low leakage rate of high pressure water cooling vapor.

DETAILED DESCRIPTION

The following illustrative embodiments are provided to illustrate the present disclosure, these and other advantages and effects can be apparent to those in the art after reading this specification.

Figure 1:
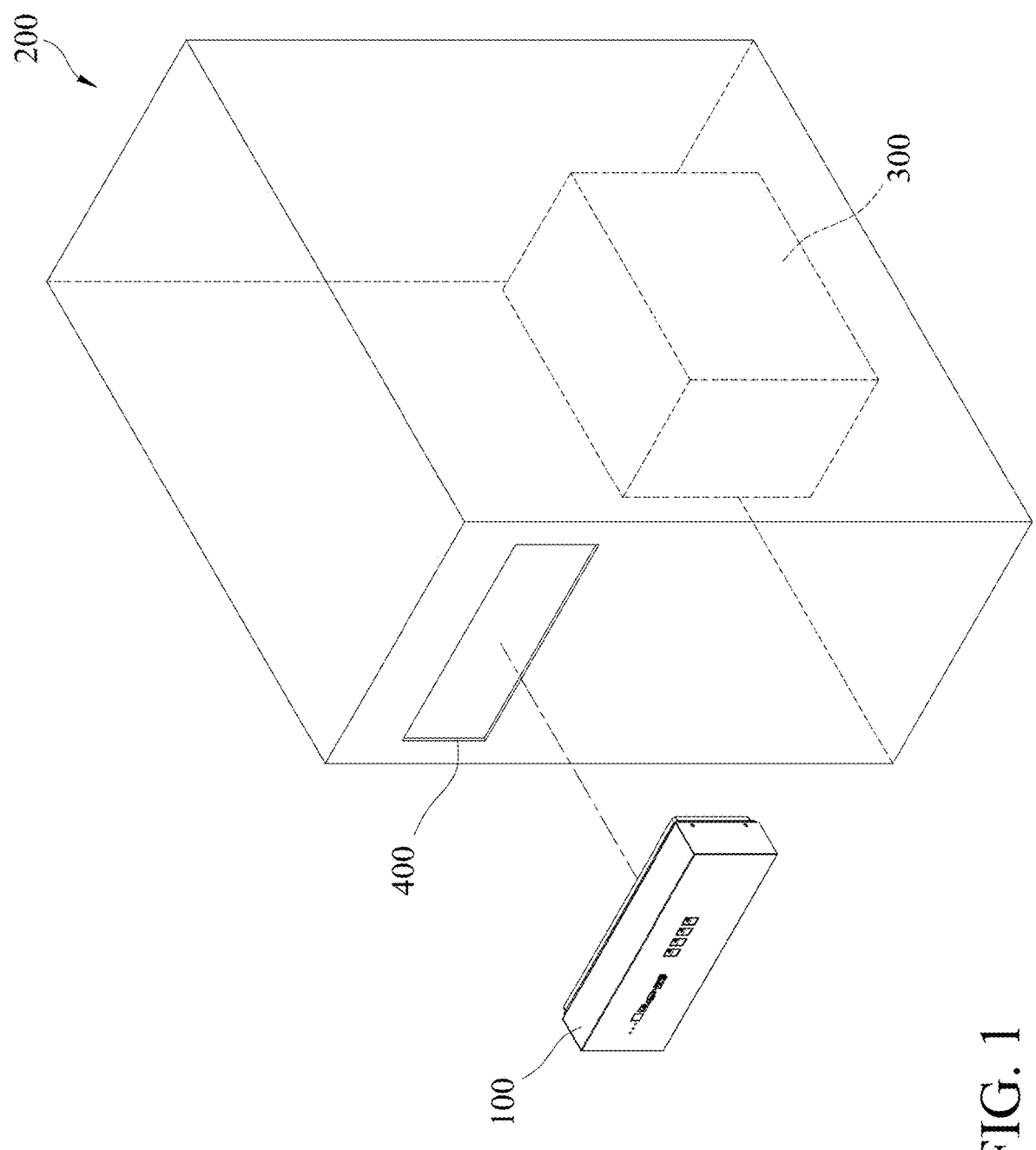
FIG. 1 is a schematic diagram showing arrangement of a switching board according to the present disclosure.
Figure 2:
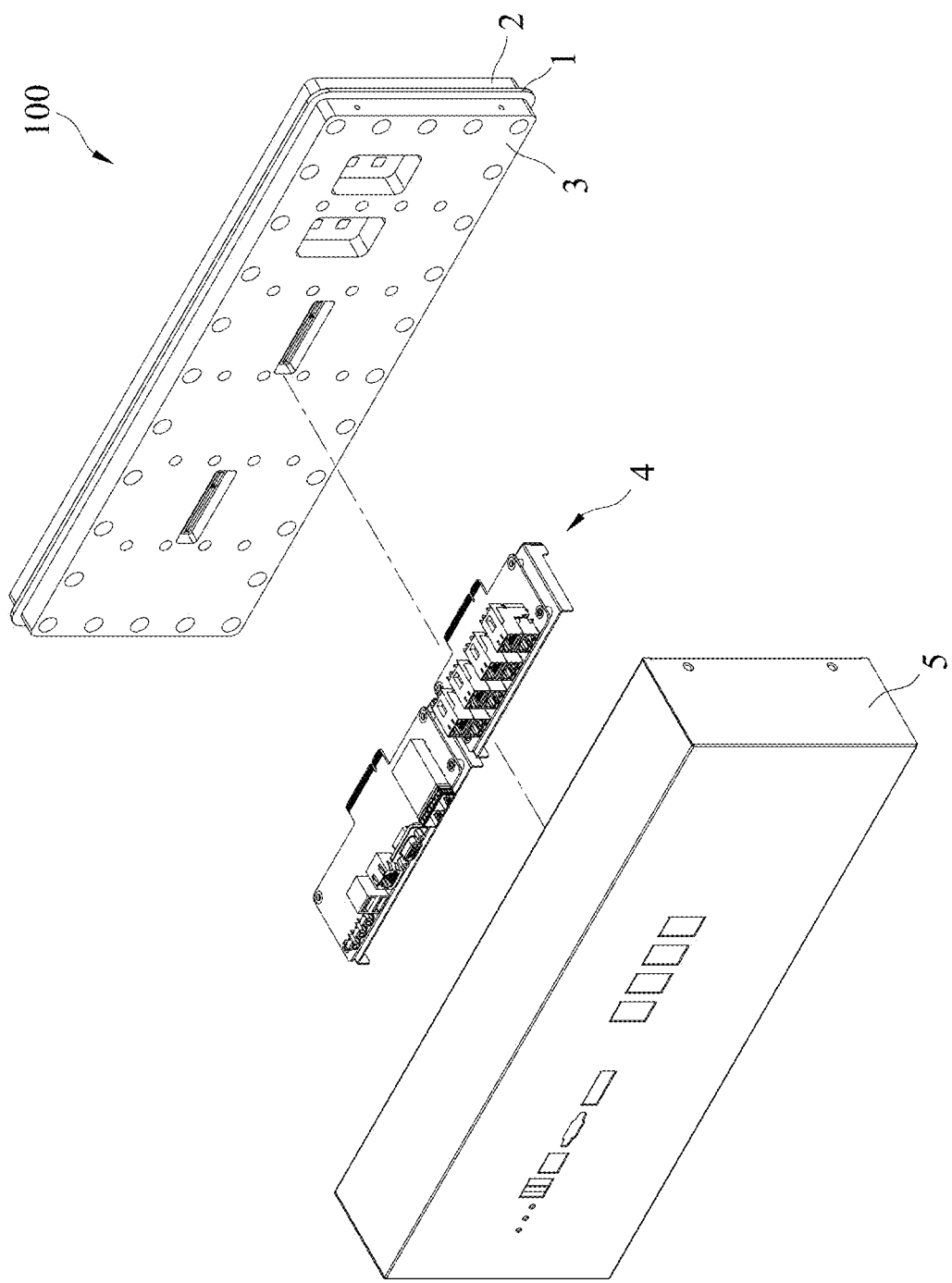
FIG. 2 is a schematic exploded diagram of some components of the switching board according to the present disclosure.

Referring to FIG. 1 and FIG. 2, a switching board 100 according to the present disclosure is disposed on a two-phase immersion cooling positive high pressure sealed tank 200 (having a server 300 therein). The switching board 100 comprises a circuit board 1, a first metal element 2, a second metal element 3, a replaceable module 4, and a cover 5. In an embodiment, the switching board 100 is disposed on a window-shaped opening 400 of the two-phase immersion cooling positive high pressure sealed tank 200. The arrangement of the switching board 100 will be described in detail.

Figure 3:
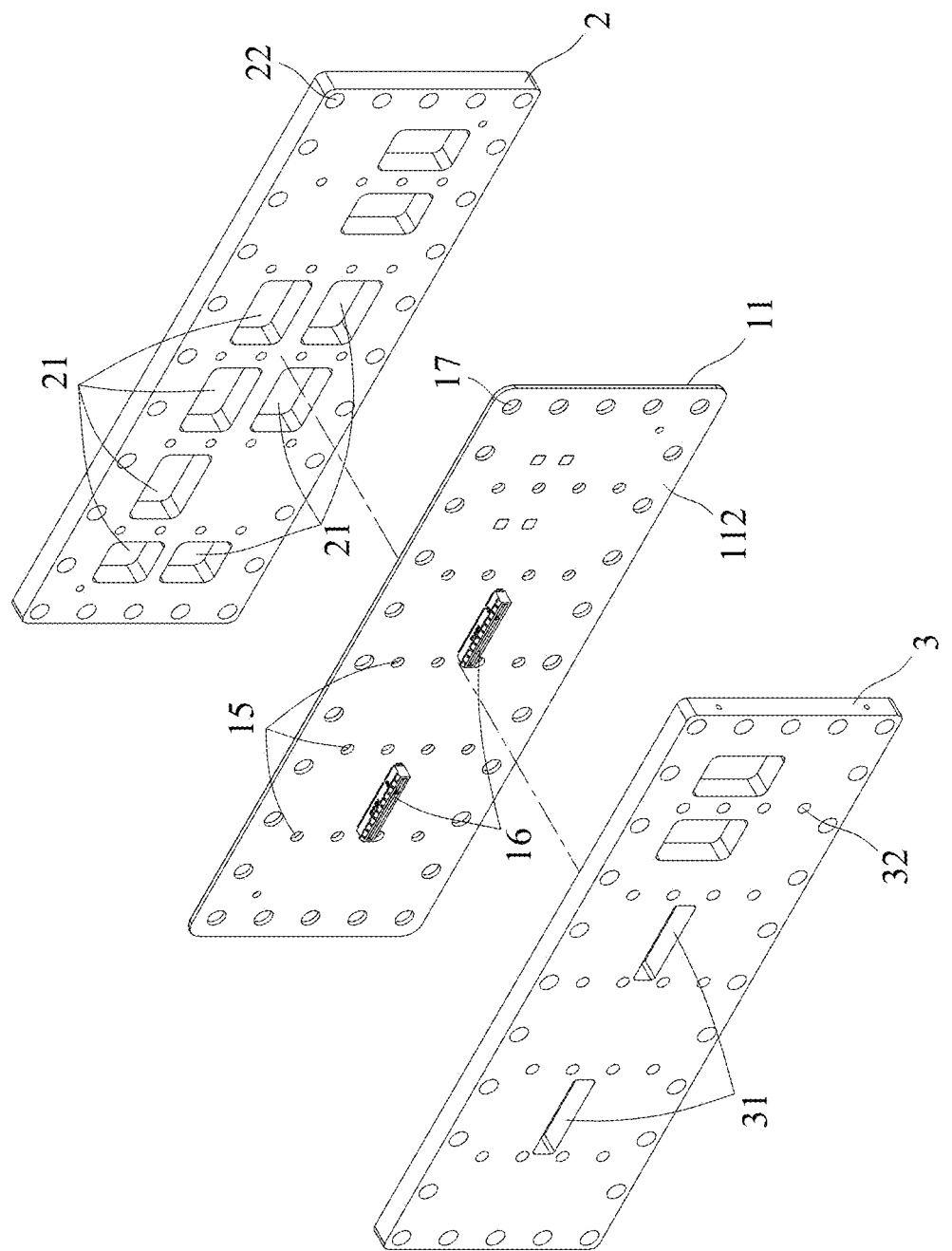
FIG. 3 is a schematic exploded diagram of some components of the switching board according to the present disclosure.
Figure 4:
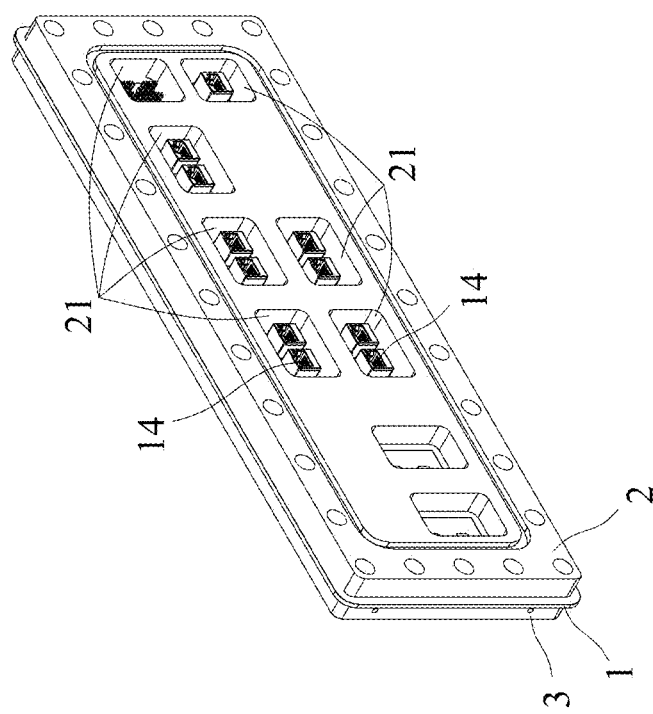
FIG. 4 is a schematic diagram showing another view of some components of the switching board according to the present disclosure.
Figure 5:
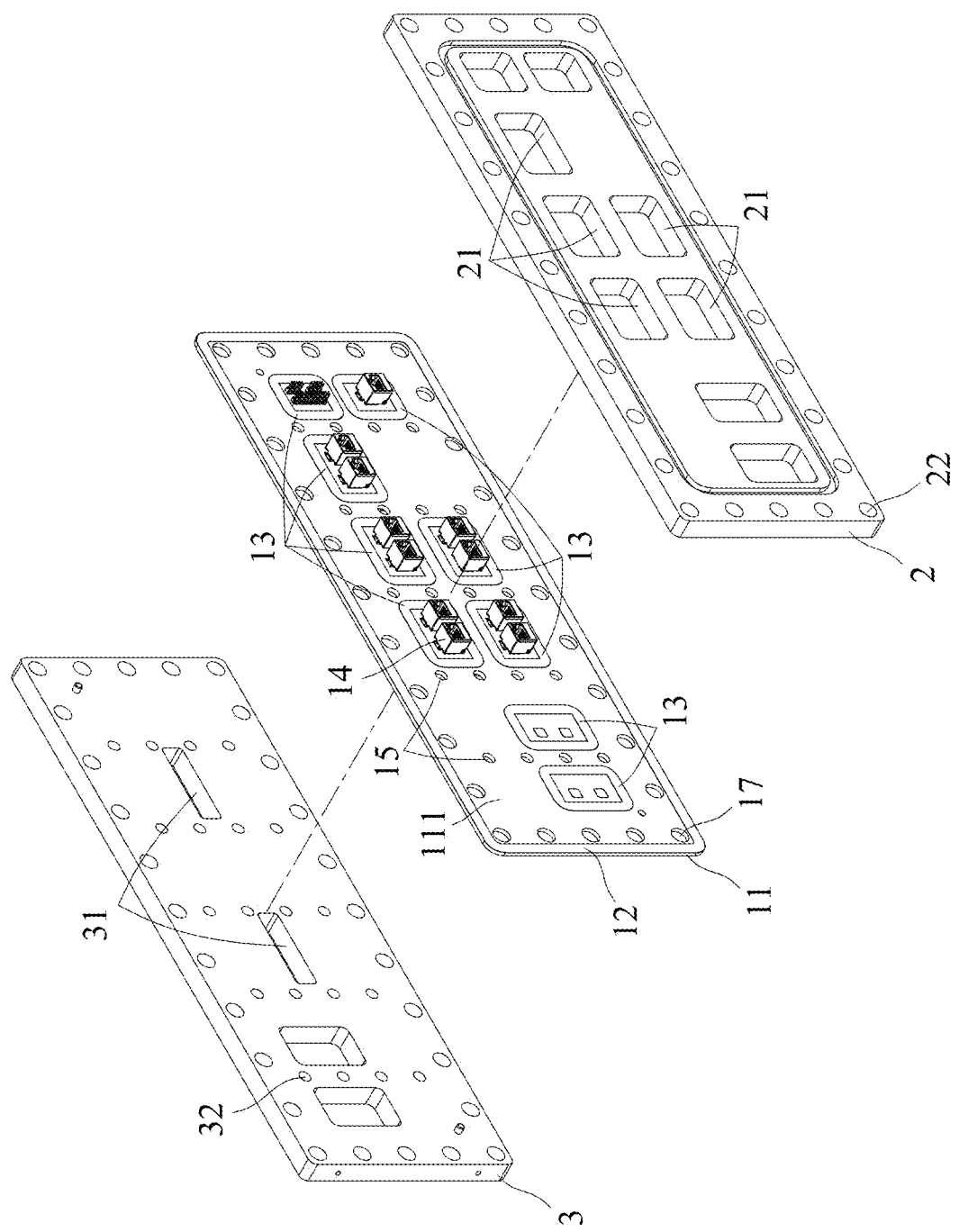
FIG. 5 is a schematic exploded diagram of FIG. 4.

Referring to FIG. 3, FIG. 4 and FIG. 5, the circuit board 1 has a board body 11, a first metal ring 12, a plurality of second metal rings 13, a plurality of switching elements 14, a plurality of vias 15 (e.g., through holes), a plurality of gold finger elements 16, and a plurality of screw holes 17. The board body 11 is of a substantially rectangular shape and has a first surface 111 and a second surface 112 opposing the first surface 111. The first metal ring 12 is formed on the first surface 111 of the board body 11 and surrounds a periphery of the board body 11. The plurality of second metal rings 13 are formed on the first surface 111 of the board body 11 and spaced apart from one another. Further, the plurality of second metal rings 13 are located inside the first metal ring 12. The plurality of switching elements 14 are disposed on the first surface 111 of the board body 11 and spaced apart from one another. Further, the plurality of switching elements 14 are surrounded by the plurality of second metal rings 13, respectively, and used to connect signal lines of the server 300, such as high-speed fiber optic network and USB signal lines. The plurality of vias 15 penetrate through the board body 11. Further, the plurality of vias 15 are located inside the first metal ring 12 but outside the plurality of second metal rings 13. The plurality of gold finger elements 16 are formed on the second surface 112 of the board body 11 and spaced apart from one another, and the plurality of gold finger elements 16 are electrically connected to the plurality of switching elements 14. The plurality of screw holes 17 penetrate through the board body 11. Further, the plurality of screw holes 17 are spaced apart from one another and adjacent to the first metal ring 12. Furthermore, the plurality of screw holes 17 are located inside the first metal ring 12 but outside the plurality of second metal rings 13. In an embodiment, the circuit board 1 is a circuit switching board used for the signal lines of the server 300.

In an embodiment, the first metal ring 12 and the plurality of second metal rings 13 are made of, but not limited to, copper foil.

The first metal element 2 is disposed on the first surface 111 of the board body 11 and fastened to the first metal ring 12 and the plurality of second metal rings 13 by a soldering process using a solder paste and a baking process using a baking unit. The soldering method will be described in detail. The first metal element 2 has a plurality of first openings 21 and a plurality of first through holes 22. After the first metal element 2 is fastened to the plurality of second metal rings 13 by soldering, the plurality of first openings 21 correspond to and expose the plurality of switching elements 14, respectively, and the plurality of second metal rings 13 surround the plurality of first openings 21, respectively. But the plurality of first openings 21 do not expose the plurality of vias 15. The plurality of first through holes 22 communicate with the plurality of screw holes 17, respectively. In an embodiment, the first metal element 2 completely covers all regions of the first surface 111 of the board body 11 inside the first metal ring 12 and outside the plurality of second metal rings 13. That is, the first metal element 2 covers all regions of the first surface 111 of the board body 11 except the plurality of switching elements 14. The second metal element 3 is disposed on the second surface 112 of the board body 11 and has a plurality of second openings 31 and a plurality of second through holes 32. The plurality of second openings 31 expose the plurality of gold finger elements 16, respectively. The plurality of second through holes 32 communicate with the plurality of vias 15, respectively. In an embodiment, the quantity of the plurality of screw holes 17 and the quantity of the plurality of first through holes 22 can be twenty-eight, respectively, and the quantity of the plurality of second through holes 32 and the quantity of the plurality of vias 15 can be twenty, respectively. But the present disclosure is not limited thereto.

In an embodiment, the first metal element 2 and the second metal element 3 are made of, but not limited to, aluminum. In an embodiment, the first metal element 2 faces an inner side of the two-phase immersion cooling positive high pressure sealed tank 200, and the second metal element 3 faces an outer side of the two-phase immersion cooling positive high pressure sealed tank 200.

The replaceable module 4 is connected to the plurality of gold finger elements 16 through the plurality of second openings 31. The replaceable module 4 can be replaced by a user at any time according to demands. In an embodiment, the replaceable module 4 is, but not limited to, an input/output (I/O) board. The cover 5 is detachably disposed on the second metal element 3 and has openings exposing the replaceable module 4.

Figure 6:
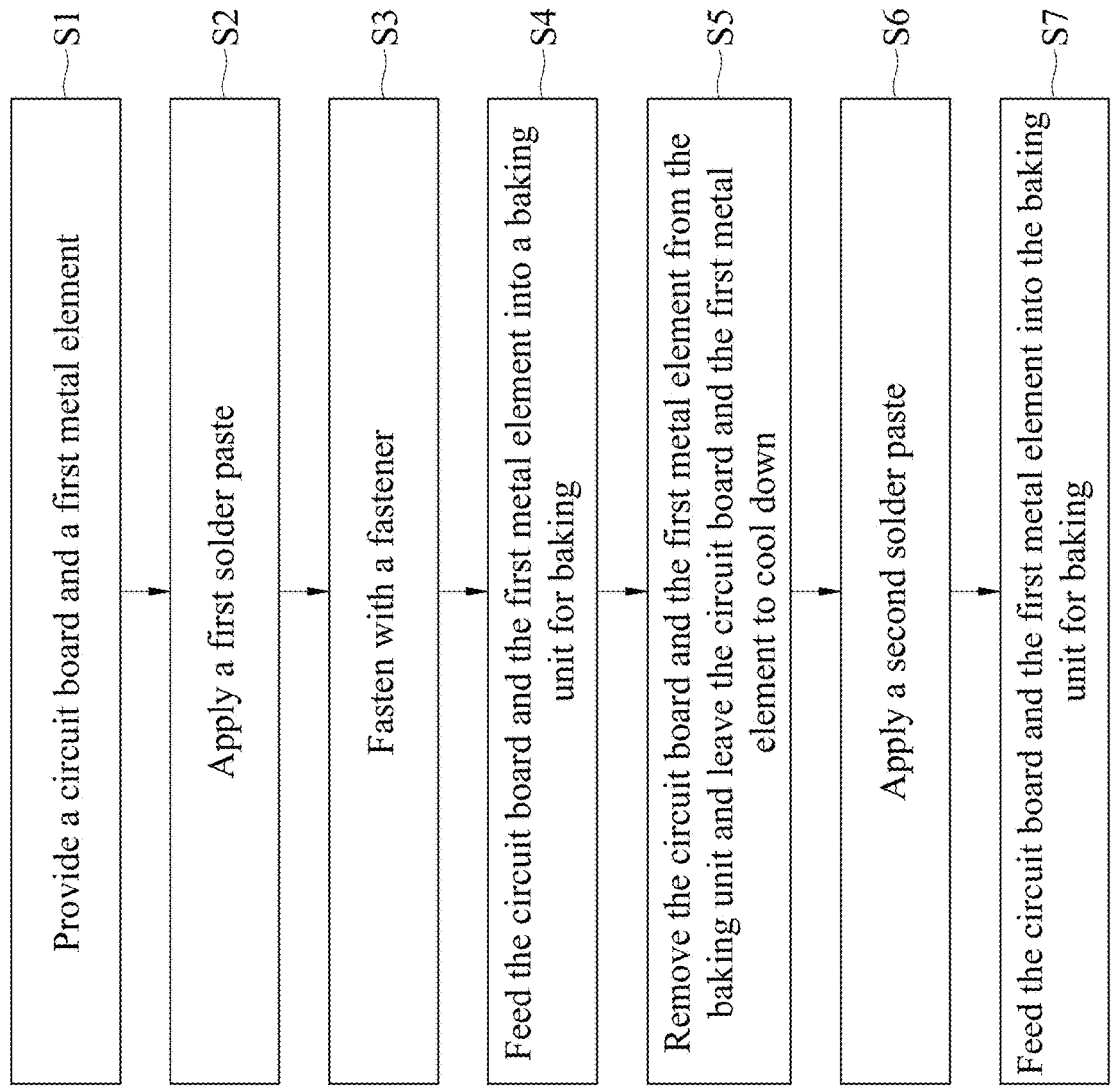
FIG. 6 is a flowchart showing a soldering method of the switching board according to the present disclosure.

The following describes a soldering method of a switching board 100 according to the present disclosure. Referring to FIG. 6, first, at step S1, a circuit board 1 and a first metal element 2 are provided. The circuit board 1 has a board body 11, a first metal ring 12 and a plurality of second metal rings 13. The board body 11 has a first surface 111 and a second surface 112 opposing the first surface 111. The first metal ring 12 is formed on the first surface 111 of the board body 11 and surrounds a periphery of the board body 11. The plurality of second metal rings 13 are formed on the first surface 111 of the board body 11 and spaced apart from one another. Further, the plurality of second metal rings 13 are located inside the first metal ring 12. Then, the process goes to step S2.

At step S2, a first solder paste is applied onto the plurality of second metal rings 13. Then, the process goes to step S3. At step S3, the first metal element 2 is disposed on and fastened to the first surface 111 of the board body 11 with a fastener so as to allow the first solder paste to be sandwiched between the first metal element 2 and the circuit board 1. In an embodiment, the first solder paste applied to each of the second metal rings 13 has a weight of 88 grams. But the present disclosure is not limited thereto. Then, the process goes to step S4.

At step S4, the circuit board 1 and the first metal element 2 fastened with the fastener are fed into a baking unit such as an oven so as to be baked at a temperature for a period of time. In an embodiment, the temperature is 220 degrees (e.g., in degree Celsius), and the period of time is 30 minutes. But the present disclosure is not limited thereto. The oven temperature can increase proportionally with such as the volume of the first metal element 2. Then, the process goes to step S5.

At step S5, after the baking process is completed, the circuit board 1 and the first metal element 2 fastened with the fastener are removed from the baking unit and left to cool down. Then, the process goes to step S6. At step S6, a second solder paste is applied to the first metal ring 12. Thereafter, the process goes to step S7. At step S7, the circuit board 1 and the first metal element 2 fastened with the fastener are fed into the baking unit so as to be baked at the same temperature and time period as the first solder paste in step S4. That is, the temperature is 220 degrees, and the period of time is 30 minutes.

Figure 7:
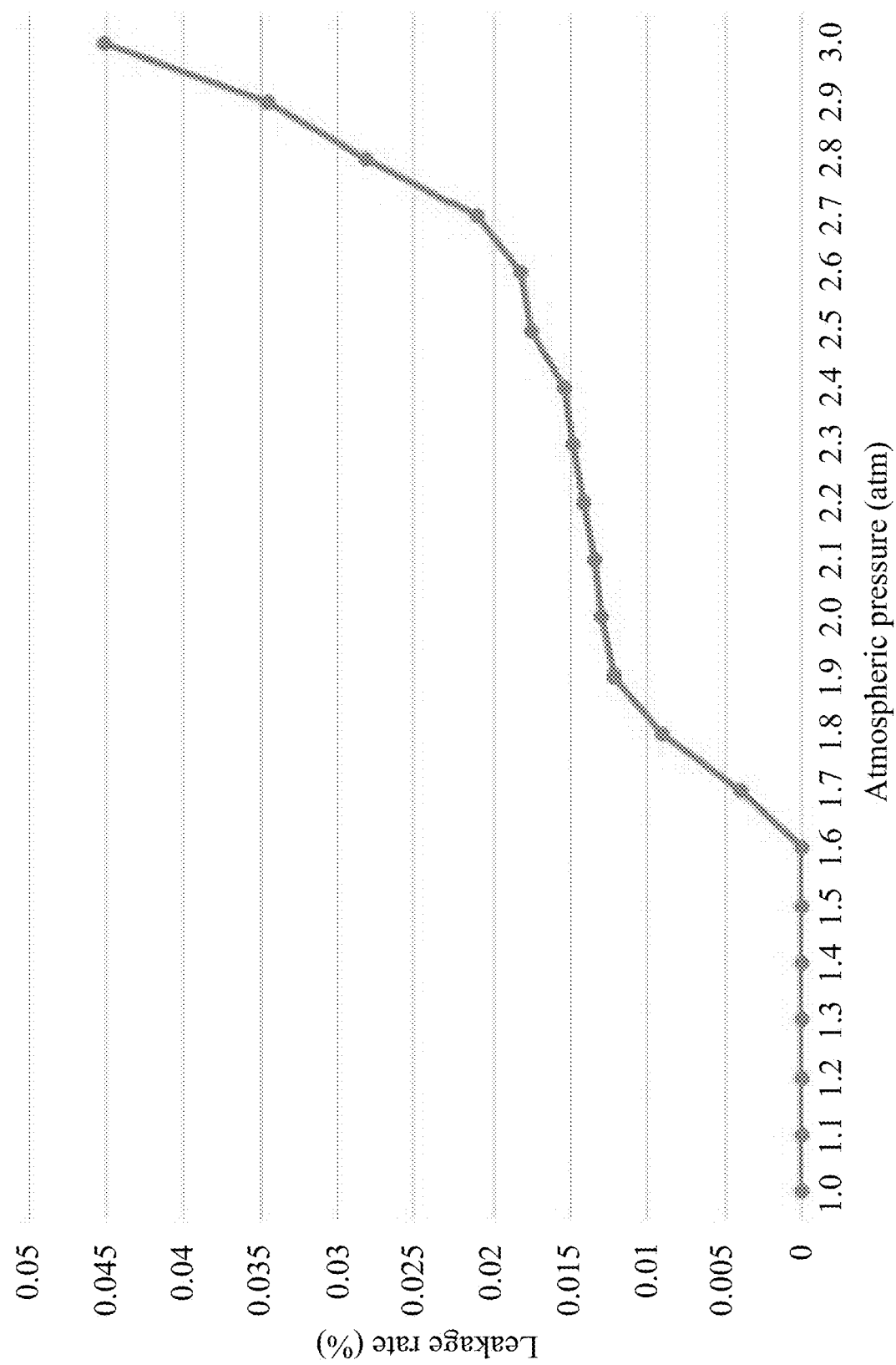
FIG. 7 is a diagram showing the results of a pressure holding test on the switching board according to the present disclosure.

The switching board 100 made by the aforementioned soldering method is then mounted to a two-phase immersion cooling positive high pressure sealed tank 200 to perform a pressure holding test. Referring to FIG. 7, when the pressure inside the tank is between 1.0 atm and 1.6 atm, the gas leakage rate is zero, and when the pressure inside the tank exceeds 1.6 atm and gradually rises to 2.4 atm, the gas leakage rate gradually increases to 0.015%. That is, under normal operating pressure, the gas leakage rate of the two-phase immersion cooling positive high pressure sealed tank 200 is almost zero.

Further, to mount the switching board 100 made by the aforementioned soldering method to the two-phase immersion cooling positive high pressure sealed tank 200, a sealing strip is first fastened to the window-shaped opening 400 and then the soldered and fastened first metal element 2 and circuit board 1 are attached to the sealing strip from an outer side of the two-phase immersion cooling positive high pressure sealed tank 200 (the first metal element 2 has a groove for receiving the sealing strip). That is, the first metal element 2 is sandwiched between the circuit board 1 and the two-phase immersion cooling positive high pressure sealed tank 200. Next, a plurality of screws (not shown) are sequentially threaded through the plurality of screw holes 17 and the plurality of first through holes 22 and fastened onto the two-phase immersion cooling positive high pressure sealed tank 200 (there are a plurality of screw holes [not shown] around the window-shaped opening 400). Thereafter, the second metal element 3 is disposed on the second surface 112 of the circuit board 1, and a plurality of screws (not shown) are threaded through the plurality of second through holes 32 and fastened to the plurality of vias 15, thus fastening the switching board 100 onto the two-phase immersion cooling positive high pressure sealed tank 200. In other embodiments, the plurality of vias 15 of the circuit board 1 and the plurality of second through holes 32 of the second metal element 3 can be omitted. Instead, the second metal element 3 has a plurality of through apertures communicating with the plurality of screw holes 17 and the plurality of first through holes 22. As such, a plurality of screws can be sequentially threaded through the plurality of through apertures, the plurality of screw holes 17 and the plurality of first through holes 22 so as to fasten the switching board 100 onto the two-phase immersion cooling positive high pressure sealed tank 200. But the present disclosure is not limited thereto.

In summary, in the switching board and the soldering method thereof according to the present disclosure, by soldering the first metal element on the circuit board, the pressure resistance of the circuit board can be increased and the risk of cracking or deformation of the circuit board under pressure can be reduced. Also, the plurality of vias are formed inside the first metal ring and outside the second metal rings by circuit arrangement, and the first metal element is further soldered to the second metal rings. As such, high pressure water cooling vapor that may leak from the switching elements cannot pass through the regions where the plurality of vias are located since the switching elements are surrounded by the second metal rings, respectively, thus achieving a complete sealing effect between the circuit board and the first metal element. Further, the circuit board is supported by the metal elements on both sides thereof so as to achieve a high pressure resistance. The switching board and the soldering method thereof according to the present disclosure have a low fabrication cost and a low leakage rate of high pressure water cooling vapor.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A switching board disposed on a two-phase immersion cooling positive high pressure sealed tank, the switching board comprising:
   a circuit board having a board body and a first metal ring, wherein the board body has a first surface, and the first metal ring is formed on the first surface and surrounds a periphery of the board body; and
   a first metal element disposed on the first surface and fastened to the first metal ring by soldering.

2. The switching board of claim 1, wherein the circuit board further has a plurality of switching elements and a plurality of second metal rings, wherein the plurality of switching elements are disposed on the first surface and spaced apart from one another, and the plurality of second metal rings are formed on the first surface and surround the plurality of switching elements, respectively.

3. The switching board of claim 2, wherein the first metal element is further fastened to the plurality of second metal rings by soldering.

4. The switching board of claim 3, wherein the first metal element has a plurality of first openings arranged in a manner that after the first metal element is fastened to the plurality of second metal rings by soldering, the plurality of first openings are surrounded by the plurality of second metal rings and the plurality of switching elements are exposed from the plurality of first openings, respectively.

5. The switching board of claim 4, wherein the circuit board further has a plurality of vias penetrating through the board body, and the plurality of vias are neither located inside the plurality of second metal rings nor exposed from the plurality of first openings.

6. The switching board of claim 5, wherein the first metal element completely covers all regions of the first surface inside the first metal ring and outside the plurality of second metal rings.

7. The switching board of claim 6, wherein the first metal ring and the plurality of second metal rings are made of copper foil.

8. The switching board of claim 7, wherein the first metal element is fastened to the first metal ring and the plurality of second metal rings by a soldering process using a solder paste and a baking process using a baking unit.

9. The switching board of claim 2, wherein the board body further has a second surface opposing the first surface, and the switching board further comprises a second metal element disposed on the second surface.

10. The switching board of claim 9, wherein the second metal element has a plurality of second openings, wherein the circuit board further has a plurality of gold finger elements formed on the second surface and spaced apart from one another, and the plurality of gold finger elements are exposed from the plurality of second openings and electrically connected to the plurality of switching elements, respectively.

11. The switching board of claim 10, wherein the first metal element faces an inner side of the two-phase immersion cooling positive high pressure sealed tank, and the second metal element faces an outer side of the two-phase immersion cooling positive high pressure sealed tank.

12. The switching board of claim 11, wherein the first metal element and the second metal element are made of aluminum.

13. A soldering method of a switching board, comprising:
   providing a circuit board and a first metal element, wherein the circuit board has a board body and a plurality of second metal rings, the board body has a first surface, and the plurality of second metal rings are formed on the first surface and spaced apart from one another;
   applying a first solder paste onto the plurality of second metal rings, and disposing and fastening the first metal element onto the first surface with a fastener to allow the first solder paste to be sandwiched between the first metal element and the circuit board; and
   feeding the circuit board and the first metal element fastened with the fastener into a baking unit, and performing baking at a temperature for a period of time.

14. The soldering method of claim 13, wherein the circuit board further has a first metal ring formed on the first surface and surrounding a periphery of the board body.

15. The soldering method of claim 14, further comprising:
   after completing the baking, removing the circuit board and the first metal element fastened with the fastener from the baking unit and leaving the circuit board and the first metal element to cool down, applying a second solder paste to the first metal ring, feeding the circuit board and the first metal element fastened with the fastener into the baking unit, and performing baking at the temperature for the period of time.

16. The soldering method of claim 15, wherein the temperature is 220 degrees, and the period of time is 30 minutes.

17. The soldering method of claim 16, wherein the first solder paste applied to one of the plurality of second metal rings has a weight of 88 grams.

* * * * *